(12) United States Patent
Jung et al.

(10) Patent No.: US 11,456,222 B2
(45) Date of Patent: Sep. 27, 2022

(54) OVERLAY CORRECTION METHOD AND SEMICONDUCTOR FABRICATION METHOD INCLUDING THE SAME

(71) Applicant: Samsung Electronics Co., Ltd., Suwon-si (KR)

(72) Inventors: Woo-Yong Jung, Seoul (KR); Jinsun Kim, Seoul (KR); Seungyoon Lee, Seoul (KR); Jeongjin Lee, Hwaseong-si (KR); Chan Hwang, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 300 days.

(21) Appl. No.: 16/886,237

(22) Filed: May 28, 2020

(65) Prior Publication Data

US 2021/0116803 A1 Apr. 22, 2021

(30) Foreign Application Priority Data

Oct. 18, 2019 (KR) .......................... 10-2019-0130075

(51) Int. Cl.
*H01L 21/66* (2006.01)
*G03F 7/20* (2006.01)

(52) U.S. Cl.
CPC .......... *H01L 22/20* (2013.01); *G03F 7/70633* (2013.01)

(58) Field of Classification Search
CPC ............................ G03F 7/70633; H01L 22/20

USPC ...................................................... 430/22, 30
See application file for complete search history.

(56) References Cited

U.S. PATENT DOCUMENTS

| 6,008,880 | A | 12/1999 | Higashiki et al. |
| 8,762,901 | B2 | 6/2014 | Lee et al. |
| 9,679,821 | B2 | 6/2017 | Jung et al. |
| 2012/0201447 | A1 | 8/2012 | Shim |
| 2019/0033708 | A1 | 1/2019 | Cherala et al. |

FOREIGN PATENT DOCUMENTS

| KR | 10-2001-0075952 A | 8/2001 |
| KR | 10-2007-0043215 A | 4/2007 |
| KR | 100714266 B1 | 5/2007 |
| KR | 10-2007-0088859 A | 8/2007 |

*Primary Examiner* — Christopher G Young
(74) *Attorney, Agent, or Firm* — Harness, Dickey & Pierce, P.L.C.

(57) ABSTRACT

An overlay correction method may include obtaining a first central line of a lower pattern on a substrate, forming a photoresist pattern on the lower pattern, obtaining an ADI overlay value corresponding to a first distance between a second central line of an upper flat surface of the lower pattern and a third central line of the photoresist pattern, obtaining an asymmetrical overlay value corresponding to a second distance between the first and second central lines, form an upper pattern using the photoresist pattern, obtaining an ACI overlay value corresponding to a third distance between the first central line and a fourth central line of the upper pattern, subtracting the ADI overlay value from the ACI overlay value to obtain a first overlay skew value, and adding the asymmetrical overlay value to the first overlay skew value to obtain a second overlay skew value.

20 Claims, 9 Drawing Sheets

OVERLAY CORRECTION METHOD AND SEMICONDUCTOR FABRICATION METHOD INCLUDING THE SAME

CROSS-REFERENCE TO RELATED APPLICATION

This U.S. non-provisional application claims the benefit of priority under 35 U.S.C § 119 to Korean Patent Application No. 10-2019-0130075, filed on Oct. 18, 2019, in the Korean Intellectual Property Office, the entire disclosure of which is hereby incorporated by reference in its entirety.

BACKGROUND

Various example embodiments of the present inventive concepts relate to a semiconductor fabrication method, semiconductor device, and/or semiconductor fabrication system, and more particularly, to an overlay correction method and/or a semiconductor fabrication method including the same.

An overlay measurement process is used to detect the degree of distortion between lower and upper patterns on a semiconductor substrate. The overlay measurement process may be performed at many positions of the substrate, and thus a plurality of measurement values may be obtained. The overlay measurement process may yield a plurality of different overlay measurement values for many positions of the substrate.

SUMMARY

Various example embodiments of the present inventive concepts provide an overlay correction method that increases the uniformity of overlay correction values, and a semiconductor fabrication method including the same.

In at least one example embodiment, an overlay correction method may include: measuring, using processing circuitry, a lower pattern on a substrate to obtain a first central line of the lower pattern; forming, using the processing circuitry, a photoresist pattern on the lower pattern; measuring, using the processing circuitry, a first distance between a second central line of an upper flat surface of the lower pattern and a third central line of the photoresist pattern; calculating, using the processing circuitry, an after-development-inspection (ADI) overlay value based on the measured first distance; measuring, using the processing circuitry, a second distance between the second central line and the first central line; calculating, using the processing circuitry, an asymmetrical overlay value based on the measured second distance; forming, using the processing circuitry, an upper pattern on the substrate using the photoresist pattern; measuring, using the processing circuitry, a third distance between the first central line and a fourth central line of the upper pattern; calculating, using the processing circuitry, an after-cleaning-inspection (ACI) overlay value based on the measured third distance; calculating, using the processing circuitry, a first overlay skew value based on the ADI overlay value and the ACI overlay value; calculating, using the processing circuitry, a second overlay skew value based on the asymmetrical overlay value and the first overlay skew value; and adjusting, using the processing circuitry, a position of the photoresist pattern based on the second overlay skew value.

In at least one example embodiment, an overlay correction method may comprise: forming, using processing circuitry, an upper thin layer on a lower pattern of a substrate; forming, using the processing circuitry, a photoresist pattern on the upper thin layer; measuring, using the processing circuitry, a first distance between a central line of an upper flat surface of the lower pattern and a central line of the photoresist pattern; calculating, using the processing circuitry, an after-development-inspection (ADI) overlay value based on the measured first distance; measuring, using the processing circuitry, a second distance between a central line of the lower pattern and the central line of the upper flat surface; calculating, using the processing circuitry, an asymmetrical overlay value based on the second distance; etching, using the processing circuitry, the upper thin layer using the photoresist pattern as an etching mask to form an upper pattern on the substrate; measuring, using the processing circuitry, a third distance between the central line of the lower pattern and a central line of the upper pattern; calculating, using the processing circuitry, an after-cleaning-inspection (ACI) overlay value based on the measured third distance; calculating, using the processing circuitry, a first overlay skew value based on the ADI overlay value the ACI overlay value; updating, using the processing circuitry, the asymmetrical overlay value based on a weighting coefficient; calculating, using the processing circuitry, a second overlay skew value based on the asymmetrical overlay value and the first overlay skew value; and adjusting, using the processing circuitry, a position of the photoresist pattern based on the second overlay skew value.

In at least one example embodiment, a semiconductor fabrication method may comprise: forming, using processing circuitry, a lower pattern on a substrate; obtaining, using the processing circuitry, a first central line of the lower pattern using an electron microscope; forming, using the processing circuitry, an upper thin layer on the lower pattern; forming, using the processing circuitry, a photoresist pattern on the upper thin layer; measuring, using the processing circuitry, a first distance between a second central line of an upper flat surface of the lower pattern and a third central line of the photoresist pattern using an optical microscope; calculating, using the processing circuitry, an after-development-inspection (ADI) overlay value based on the measured first distance; calculating, using the processing circuitry, an asymmetrical overlay value that corresponds to a second distance between the second central line and the first central line; etching, using the processing circuitry, the upper thin layer using the photoresist pattern as an etching mask to form an upper pattern; measuring, using the processing circuitry, a third distance between the first central line and a fourth central line of the upper pattern using the electron microscope; calculating, using the processing circuitry, an after-cleaning-inspection (ACI) overlay value based on the measured third distance; calculating, using the processing circuitry, a first overlay skew value based on the ADI overlay value and the ACI overlay value; calculating, using the processing circuitry, a second overlay skew value based on the asymmetrical overlay value and the first overlay skew value; and adjusting, using the processing circuitry, a position of the photoresist pattern based on the second overlay skew value.

DETAILED DESCRIPTION

Figure 1:
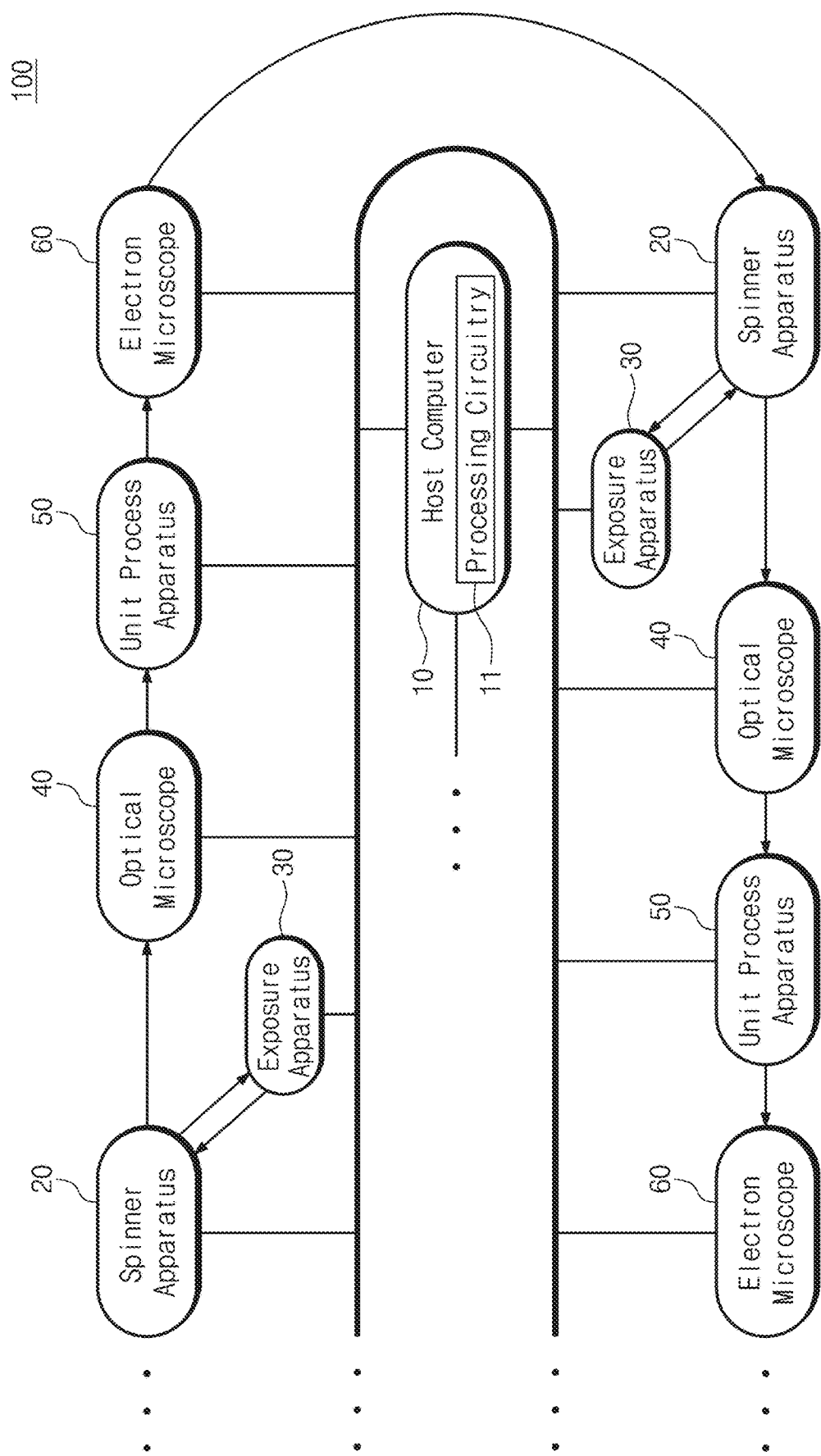
FIG. 1 illustrates a schematic diagram showing an example of semiconductor fabrication facilities according to at least one example embodiment of the present inventive concepts.

FIG. 1 shows an example of a semiconductor fabrication facility 100 according to at least one example embodiment of the present inventive concepts.

Referring to FIG. 1, the semiconductor fabrication facility 100 may include a host computer 10, a spinner apparatus 20, an exposure apparatus 30, an optical microscope 40, a unit process apparatus 50, and/or an electron microscope 60, etc., but the example embodiments are not limited thereto and there may be a greater or lesser number of constituent elements.

The host computer 10 may be connected to the spinner apparatus 20, the exposure apparatus 30, the optical microscope 40, the unit process apparatus 50, and/or the electron microscope 60, etc. The host computer 10 may monitor, command, and/or control a fabrication process and an overlay measurement process that are performed on a semiconductor substrate (e.g., see W of FIG. 3) by the spinner apparatus 20, the exposure apparatus 30, the optical microscope 40, the unit process apparatus 50, and/or the electron microscope 60, etc., by transmitting commands and/or instructions to the various semiconductor fabrication facility apparatuses, and receiving data from the various semiconductor fabrication facility apparatuses. For example, the host computer 10 may provide the exposure apparatus 30 with overlay correction values that are obtained from the optical and electron microscopes 40 and 60, but the example embodiments of the present inventive concepts are not limited thereto. Additionally, the processing circuitry 11 may include a central processing unit (CPU), or a microprocessor (MP), an arithmetic logic unit (ALU), a digital signal processor, a microcomputer, a field programmable gate array (FPGA), a System-on-Chip (SoC), a programmable logic unit, application-specific integrated circuit (ASIC), etc., and/or may be a hard-wired circuit including logic circuits, or combinations thereof, but the example embodiments are not limited thereto. The processing circuitry 11 may control the overall operation of the host computer 10. In at least one example embodiment, the processing circuitry 11 may be implemented as a multi-core processor, for example, a dual-core processor, or a quad-core processor, etc. According to at least on example embodiment, the processing circuitry 11 may control the functionality of at least one of the spinner apparatus 20, the exposure apparatus 30, the optical microscope 40, the unit process apparatus 50, and/or the electron microscope 60, etc. Additionally, one or more of the spinner apparatus 20, the exposure apparatus 30, the optical microscope 40, the unit process apparatus 50, and/or the electron microscope 60 may also include processing circuitry (not shown) to control the functionality of the respective apparatus.

Figure 4:
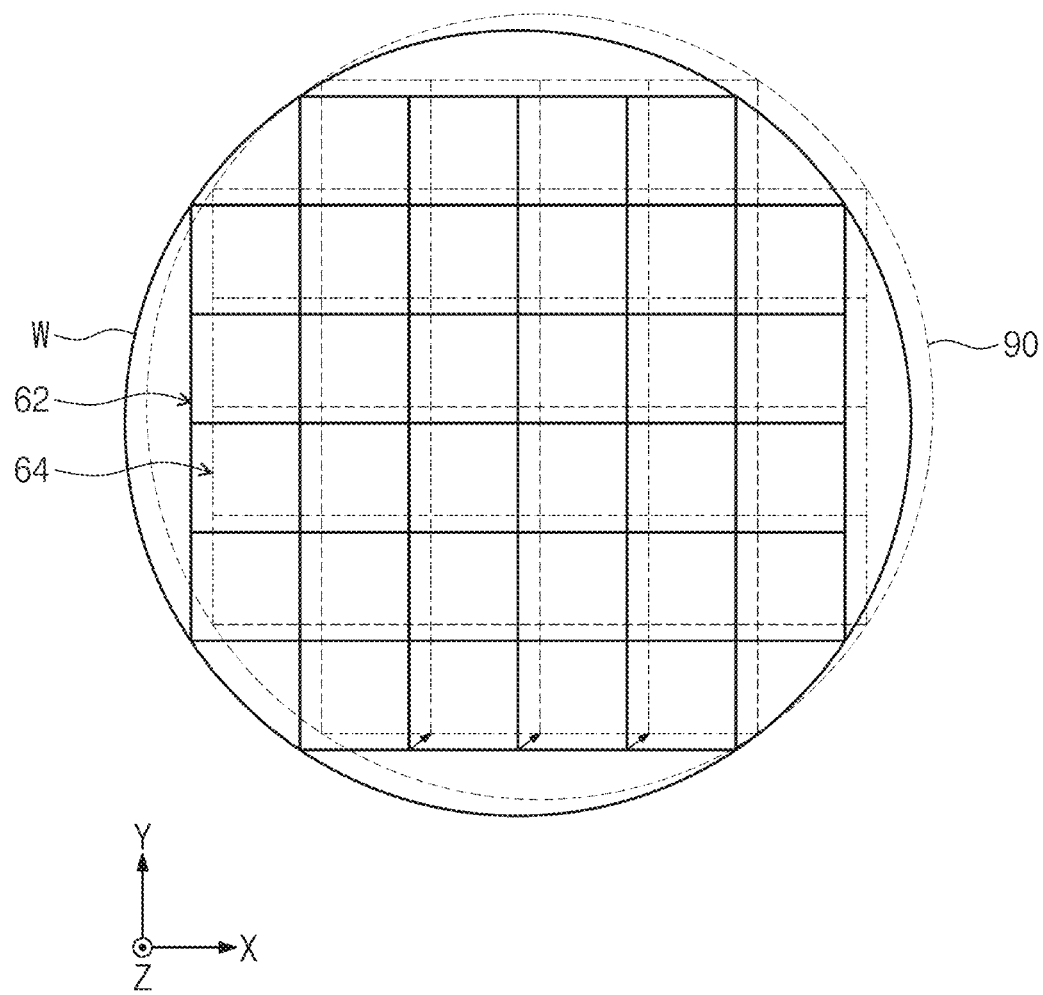

The spinner apparatus 20 may coat a photoresist (e.g., see PR of FIG. 9) on the substrate W and may develop the photoresist PR that is exposed by the exposure apparatus 30, thereby forming a photoresist pattern (e.g., see 64 of FIG. 4).

The exposure apparatus 30 may be located adjacent to the spinner apparatus 20, but is not limited thereto. The exposure apparatus 30 may be configured such that the photoresist PR is partially exposed to light source, such as a source emitting an ultraviolet (UV) ray or an extreme ultraviolet (EUV) ray, etc., but is not limited thereto. The exposure apparatus 30 may have a reticle with a mask pattern that corresponds to a reference pattern which will be formed on the substrate W, but is not limited thereto. For example, the exposure apparatus 30 may include an EUV exposure apparatus, an ArF exposure apparatus, a KrF exposure apparatus, an I-line exposure apparatus, and/or a G-line exposure apparatus, etc.

The optical microscope 40 may be placed between the spinner apparatus 20 and the unit process apparatus 50, but is not limited thereto. The optical microscope 40 may view, sense, and/or measure the photoresist pattern 64 and/or a lower pattern (e.g., see 62 of FIG. 3) below the photoresist pattern 64, thereby obtaining an overlay image of the photoresist pattern 64 and/or the lower pattern. The host computer 10 and/or the optical microscope 40 may use the overlay image to obtain an after-development-inspection (ADI) overlay value (see 80 of FIG. 5). However, the example embodiments are not limited thereto and, for example, a second scanning microscope, electron scanning microscope, digital microscope, optical camera, depth sensing camera, etc., may be used instead of, or in addition to, the optical microscope 40.

The unit process apparatus 50 may be placed between the optical microscope 40 and the electron microscope 60, but is not limited thereto. The unit process apparatus 50 may include, for example, one or more of a film deposition apparatus, an etching apparatus, a polishing apparatus, an ion implantation apparatus, and/or an ashing apparatus, etc., but is not limited thereto. The unit process apparatus 50 may use the photoresist pattern 64 as an etching mask to etch the photoresist, the substrate W, and/or a thin layer (e.g., an oxidation layer, a metallization layer, etc.) on the substrate W, using for example, an acid solution, etc. In addition, the unit process apparatus 50 may polish and planarize the substrate W and/or the thin layer, etc., but the example embodiments of the present inventive concepts are not limited thereto. For example, the unit process apparatus 50 may form a lower pattern (e.g., see 62 of FIG. 7), an upper thin layer (e.g., see 63 of FIG. 8), and an upper pattern (e.g., see 66 of FIG. 10), etc.

The electron microscope 60 may be placed between the unit process apparatus 50 and the spinner apparatus 20, but is not limited thereto. Additionally, the electron microscope 60 may be placed between a plurality of unit process apparatuses 50, etc. The host computer 10 and/or the electron microscope 60 may measure the lower pattern 62 and/or the upper pattern 66, etc., to obtain an image of the lower pattern 62 and/or an image of the upper pattern 66, etc. The host computer 10 and/or the electron microscope 60 may use the images of the lower and upper patterns 62 and 66, etc., to obtain an after-cleaning-inspection (ACI) overlay value (e.g., see 90 of FIG. 6). The ACI overlay value 90 may be an on-cell overlay value.

The following will describe a semiconductor fabrication method using the semiconductor fabrication facility 100 configured as described above for the sake of brevity and clarity, but the example embodiments of the semiconductor fabrication method are not limited thereto and may be performed using other semiconductor fabrication facilities as well.

Figure 2:
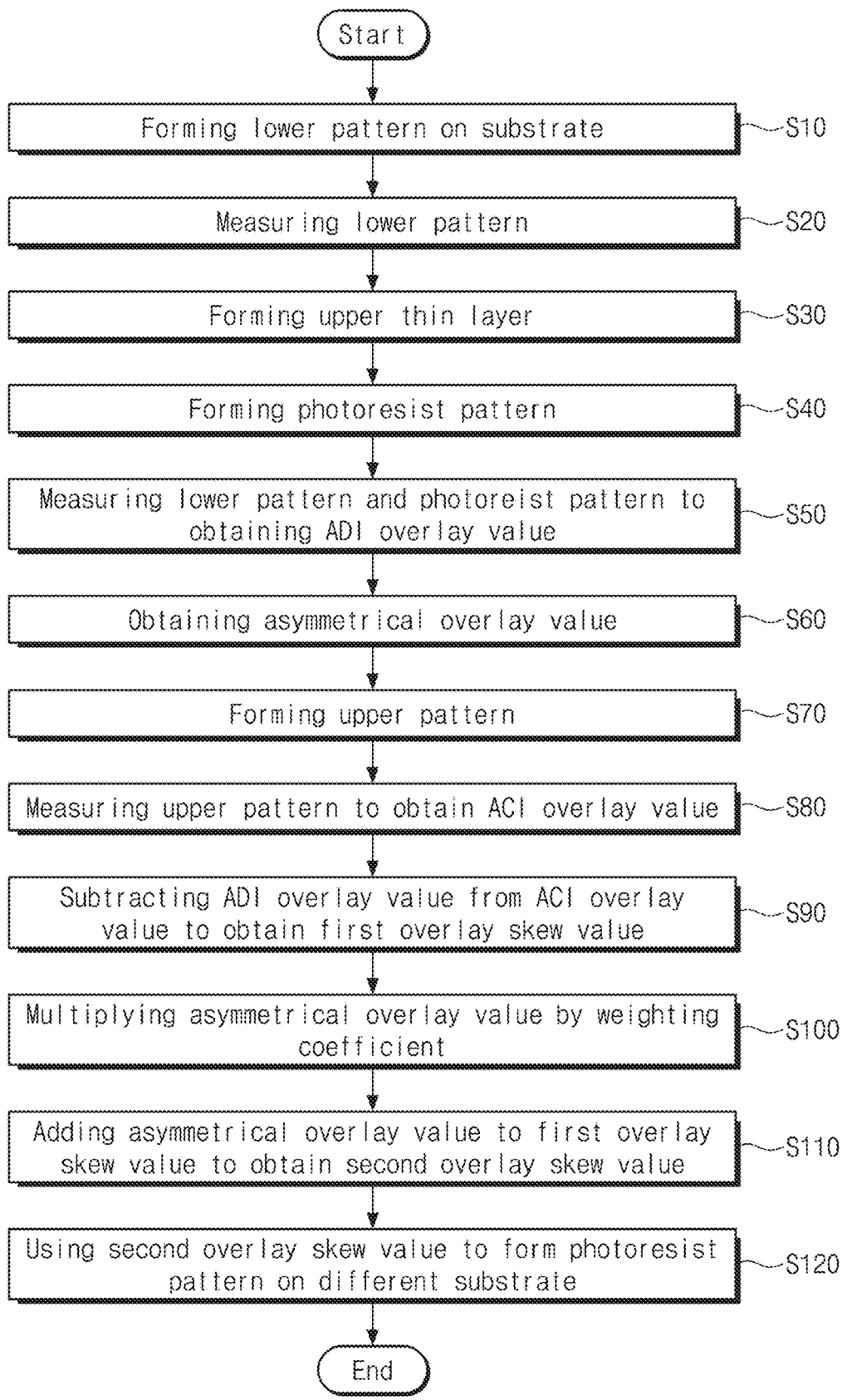
FIG. 2 illustrates a flow chart showing an example of semiconductor fabrication methods according to at least one example embodiment of the present inventive concepts.

FIG. 2 shows an example of semiconductor fabrication methods according to at least one example embodiment of the present inventive concepts. FIGS. 3 to 6 illustrate plan views showing a semiconductor fabrication method according to at least one example embodiment of the present inventive concepts. FIGS. 7 to 10 show examples of the lower pattern 62, the photoresist pattern 64, and the upper pattern 66 depicted in FIGS. 3 to 6 according to some example embodiments.

Figure 3:
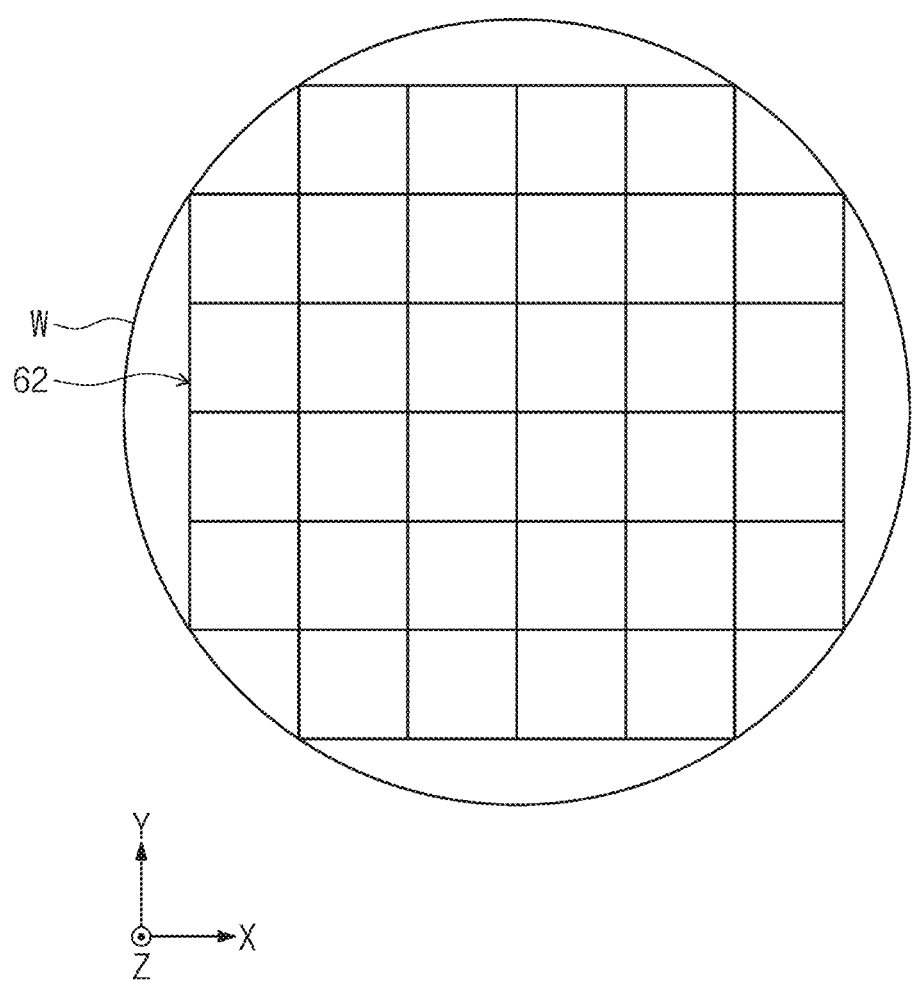
FIGS. 3 to 6 illustrate plan views showing a semiconductor fabrication method according to some example embodiments of the present inventive concepts.
Figure 7:
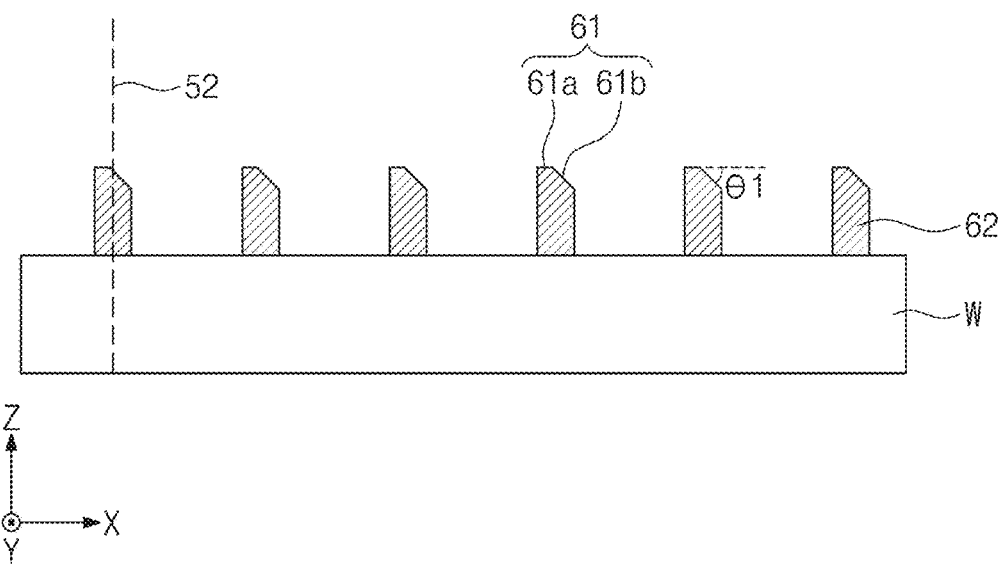
FIGS. 7 to 10 illustrate cross-sectional views showing examples of a lower pattern, a photoresist pattern, and an upper pattern depicted in FIGS. 3 to 6, according to some example embodiments.

Referring to FIGS. 2, 3, and 7, the unit process apparatus 50 may form the lower pattern 62 on the substrate W (S10). For example, the lower pattern 62 may include an embossed metal pattern. For another example, the lower pattern 62 may include an engraved hole pattern, but the example embodiments of the present inventive concepts are not limited thereto. The lower pattern 62 may have a top surface 61 whose shape is asymmetrical in a first direction X, but the example embodiments are not limited thereto. The lower pattern 62 may have a width of about 30 μm or less, is not limited thereto and may be larger or smaller. For example, the lower pattern 62 may have a width of about 10 nm, etc. The top surface 61 of the lower pattern 62 may have, for example, an upper flat surface 61a, and/or an inclined surface 61b, but is not limited thereto. For example, in some example embodiments, the top surface 61 of the lower pattern 62 may have a declined surface, etc. The upper flat surface 61a may be parallel to a top surface of the substrate W, but is not limited thereto, and may be askew to the top surface of the substrate W, etc. The inclined surface 61b may be formed on a side of the upper flat surface 61a. For example, the inclined surface 61b may be a defect resulting from a failure of etching and/or polishing on the lower pattern 62. The inclined surface 61b may have an inclination angle θ1 relative to the upper flat surface 61a. For example, the inclined surface 61b may have an area less than that of the upper flat surface 61a, but is not limited thereto. For ease of description of overlay correction values, FIG. 7 illustrates that the inclined surface 61b is larger than the upper flat surface 61a, but the example embodiments are not limited thereto. In addition, a lower thin layer may further be formed to cover a lateral surface of the lower pattern 62, which may be parallel or approximately parallel to the upper flat surface 61a, and may selectively expose the top surface 61 of the lower pattern 62, etc.

The electron microscope 60 may scan, sense, view, capture, and/or measure the lower pattern 62 (S20). The electron microscope 60 may obtain an image of the lower pattern 62 and may also obtain a first central line 52 of the lower pattern 62 in the image. The lower pattern 62 may have the first central line 52, but is not limited thereto.

Figure 8:
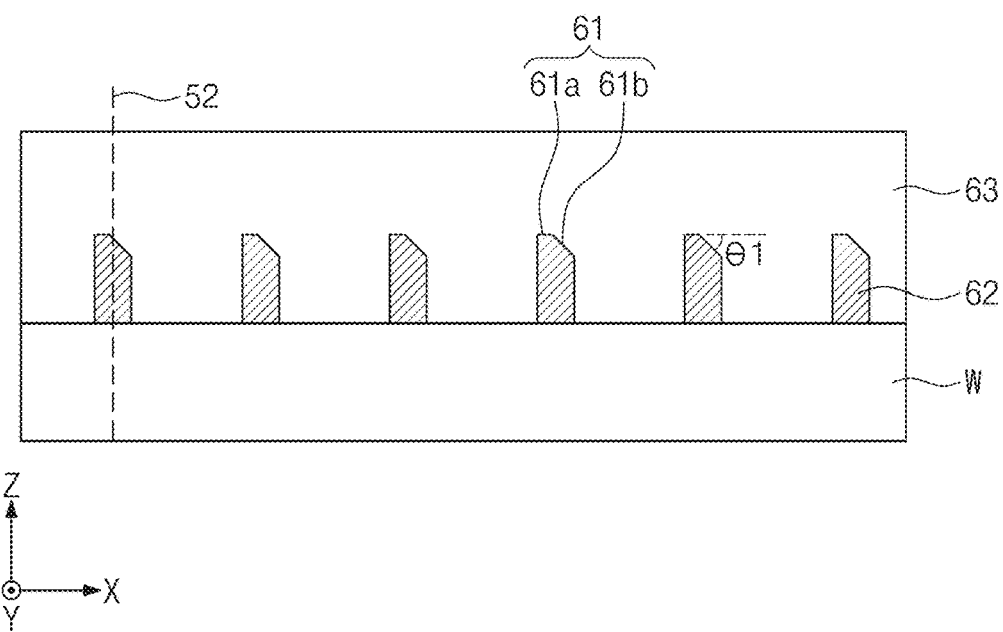

Referring to FIGS. 2 and 8, the unit process apparatus 50 may form the upper thin layer 63 on the lower pattern 62 and the substrate W (S30), but is not limited thereto. The upper thin layer 63 may cover the lower pattern 62, etc. The upper thin layer 63 may be thicker than the lower pattern 62, but is not limited thereto. For example, the upper thin layer 63 may include a dielectric one of silicon oxide, silicon nitride, etc., that are formed by chemical vapor deposition, etc. The upper thin layer 63 may allow the lower pattern 62 to be transmitted therethrough.

Figure 9:
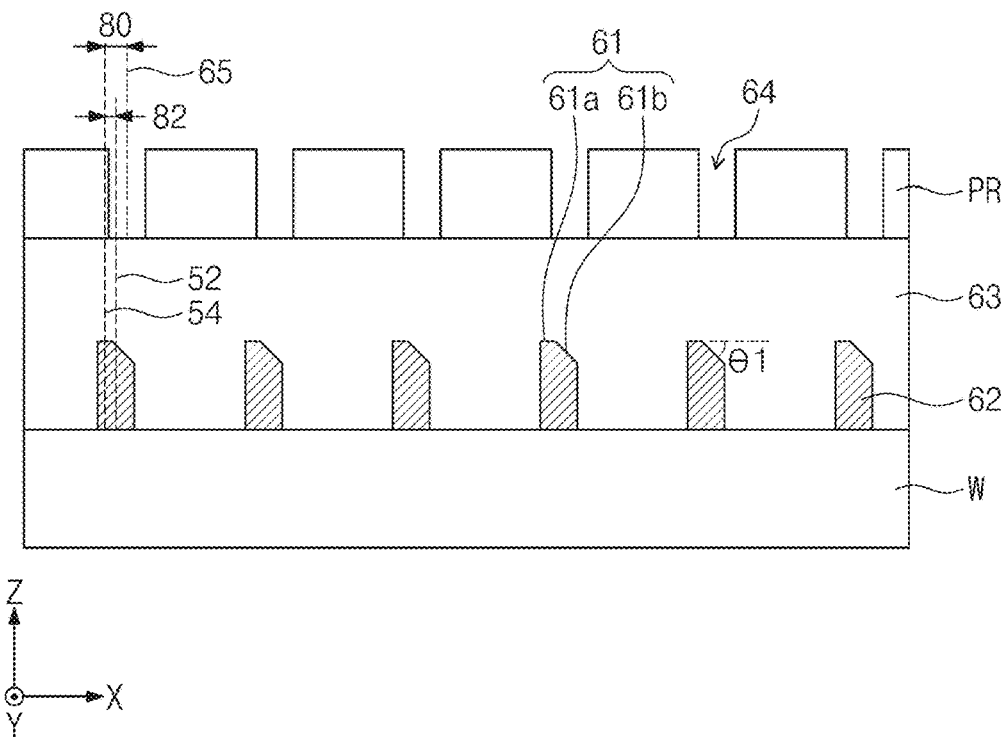

Referring to FIGS. 2, 4, and 9, the spinner apparatus 20 and the exposure apparatus 30 may form the photoresist pattern 64 on the upper thin layer 63 (S40). The spinner apparatus 20 may coat the photoresist PR on the upper thin layer 63. The exposure apparatus 30 may be configured such that the photoresist PR is exposed to light emitted from the exposure apparatus 30 in accordance with the mask pattern of the reticle. The spinner apparatus 20 may be configured such that the exposed photoresist PR is developed to form the photoresist pattern 64. The photoresist pattern 64 may be a hole pattern defined by the photoresist PR that remains on the substrate W, but is not limited thereto, and the photoresist pattern 64 may define a pattern to be etched from the substrate W, etc. The photoresist pattern 64 may exposed a portion of the upper thin layer 63. Additionally, the photoresist pattern 64 may be an embossed pattern of the photoresist PR. The photoresist pattern 64 may allow the lower pattern 62 to be transmitted therethrough.

Figure 5:
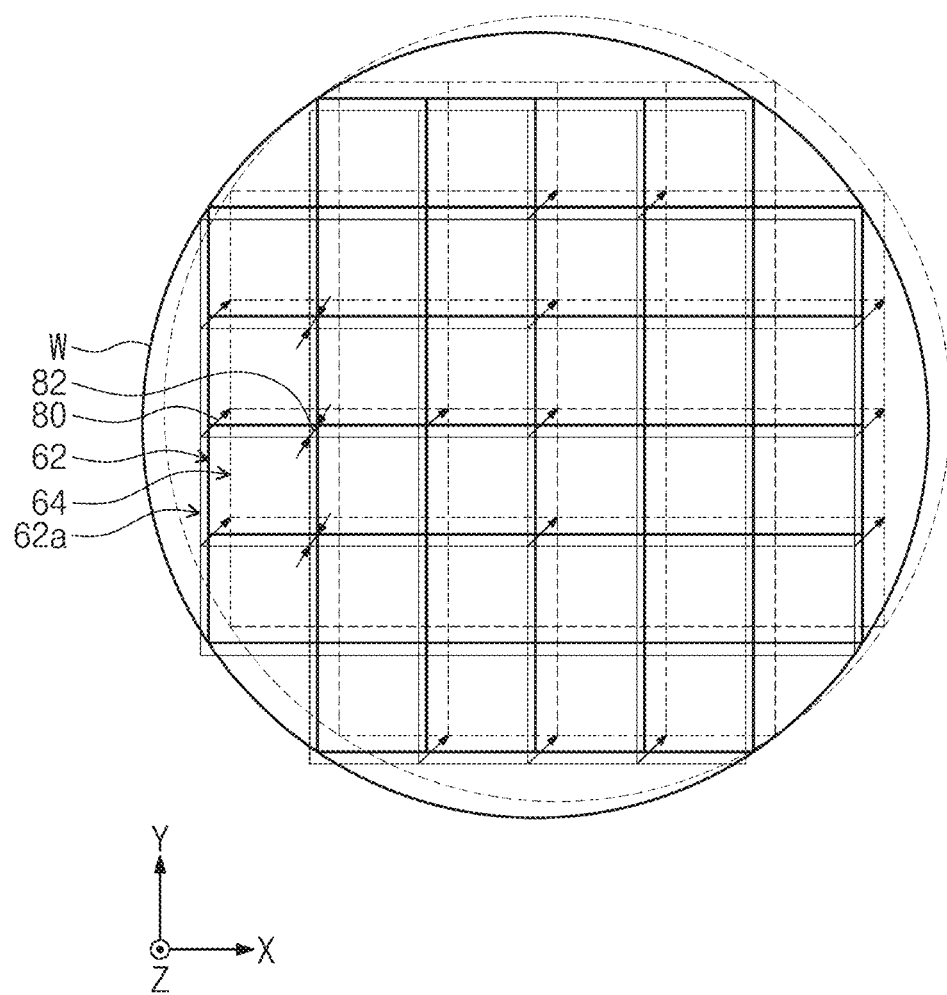

Referring to FIGS. 2, 5, and 9, the host computer 10 and/or the optical microscope 40 may measure the lower pattern 62 and the photoresist pattern 64 to obtain the ADI overlay value 80 (S50). The ADI overlay value 80 may be a difference between the photoresist pattern 64 and a transmission image 62a of the lower pattern 62. The host computer 10 and/or the optical microscope 40 may obtain the transmission image 62a of the lower pattern 62 and/or an image of the photoresist pattern 64, etc. The transmission image 62a may be an image of the upper flat surface 61a of the lower pattern 62. The inclined surface 61b may induce a scattered reflection of light, and thus it may not be easy for the optical microscope 40 to obtain an image of the inclined surface 61b and/or the image of the inclined surface 61b may appear to be distorted, imperfect, unclear, out of focus, etc. The transmission image 62a may have a second central line 54. The photoresist pattern 64 may have a third central line 65. The ADI overlay value 80 may be a first overlay correction value that corresponds to a first distance between the second central line 54 and the third central line 65. The ADI overlay value 80 may be expressed by a regression equation such as Equation 1 below, but is not limited thereto.

$$U_1 = AK_1 \quad \text{[Equation 1]}$$

In Equation 1, the term $U_1$ may correspond to the ADI overlay value 80, and the term $AK_1$ may correspond to a first reference function. The first reference function $AK_1$ may have parameters that correspond to coordinate values at a plurality of random positions and/or a plurality of desired positions of the photoresist pattern 64 at each of which the ADI overlay value 80 is obtained. In other words, parameters of the first reference function $AK_1$ correspond to (and/or include) the absolute coordinates of a plurality of reference points of the desired photoresist pattern 64, the lower pattern 62, and/or wafer W. The parameters may include a component in the first direction X and a component in a second direction Y of the Cartesian coordinate system, but is not limited thereto. For example, according to some example embodiments, the parameters may also include a component in a third direction Z, e.g., three-dimensional components, for use with a three-dimensional image obtained from an electron scanning microscope, depth sensing camera, etc. Accordingly, the first reference function $AK_1$ may include an orthogonal function in which components in the first and second directions X and Y act as independent variables. For example, the first reference function $AK_1$, or the orthogonal function, may correspond to the product of a polynomial function A and a first correlation parameter $K_1$. A matrix such as Equation 2 below may represent the ADI overlay value 80, the polynomial function A, and the first correlation parameter $K_1$, but the example embodiments are not limited thereto.

$$\begin{pmatrix} dx_{11} \\ dx_{12} \\ dx_{13} \\ \vdots \\ dx_{1n} \end{pmatrix} = \begin{pmatrix} 1 & x_1 & y_1 & x_1^2 & \cdots \\ 1 & x_2 & y_3 & x_2^2 & \cdots \\ 1 & x_3 & y_3 & x_3^2 & \cdots \\ \vdots & \vdots & \vdots & \vdots & \vdots \\ 1 & x_n & y_n & x_n^2 & \cdots \end{pmatrix} \begin{pmatrix} K_{11} \\ K_{13} \\ K_{15} \\ \vdots \\ K_{12n-1} \end{pmatrix} \quad \text{[Equation 2]}$$

$$\begin{pmatrix} dy_{11} \\ dy_{12} \\ dy_{13} \\ \vdots \\ dy_{1n} \end{pmatrix} = \begin{pmatrix} 1 & y_1 & x_1 & y_1^2 & \cdots \\ 1 & y_2 & x_3 & y_2^2 & \cdots \\ 1 & y_3 & x_3 & y_3^2 & \cdots \\ \vdots & \vdots & \vdots & \vdots & \vdots \\ 1 & y_n & x_n & y_n^2 & \cdots \end{pmatrix} \begin{pmatrix} K_{12} \\ K_{14} \\ K_{16} \\ \vdots \\ K_{12n} \end{pmatrix}$$

In Equation 2, the elements $dx_{11}$ and $dy_{11}$ may each be the ADI overlay value 80 obtained at random positions $x_1$ and $y_1$, respectively. Likewise, the elements $dx_{12}$, $dx_{13}$, ..., and $dx_{1n}$ may each be the ADI overlay value 80 measured at random and/or desired positions $x_2$, $x_3$, ..., and $x_n$, respectively, and the elements $dy_{12}$, $dy_{13}$, ..., and $dy_{1n}$ may each be the ADI overlay value 80 measured at random and/or desired positions $y_2$, $y_3$, ..., and $y_n$, respectively. Additionally, according to some example embodiments, the parameters may also include a component in a third direction Z, e.g., three-dimensional components, for use with a three-dimensional image obtained from an electron scanning microscope, depth sensing camera, etc. The elements $K_{11}$, $K_{13}$, $K_{15}$, ..., and $K_{12n-1}$ may each be the first correlation parameter $K_1$ obtained at random and/or desired positions $x_1$, $x_2$, $x_3$, ..., and $x_n$, respectively. The elements $K_{12}$, $K_{14}$, $K_{16}$, ..., and $K_{12n}$ may each be the first correlation parameter $K_1$ obtained at random positions $y_1$, $y_2$, $y_3$, ..., and $y_n$, respectively. For example, the first correlation parameter $K_1$ may include a rotation parameter, a scale parameter, and an offset parameter of the third central line 65 relative to the second central line 54. For example, the elements $K_{11}$ and $K_{12}$ may each be the first offset parameter, etc. The elements $K_{13}$ and $K_{14}$ may each be the first scale parameter, etc. The elements $K_{15}$ and $K_{16}$ may each be the first rotation parameter, etc. Accordingly, the first correlation parameter $K_1$ may include the first offset parameter, the first scale parameter, and the first rotation parameter, but is not limited thereto.

Referring to FIGS. 2 and 9, the host computer 10 and/or the optical microscope 40 may obtain an asymmetrical overlay value 82 (S60). The host computer 10 and/or the optical microscope 40 may obtain the asymmetrical overlay value 82 by comparing the transmission image 62*a* with the image of the lower pattern 62, which is the image of the lower pattern 62 obtained using the electron microscope 60. For example, the asymmetrical overlay value 82 may correspond to a second distance between the first central line 52 and the second central line 54. The asymmetrical overlay value 82 may be an asymmetrical index value and may be represented by a regression equation such as Equation 3 below, but is not limited thereto.

$$U_2 = AK_2 \quad \text{[Equation 3]}$$

In Equation 3, the term $U_2$ may correspond to the asymmetrical overlay value 82, the term A may be a polynomial function, and the term $K_2$ may be a second correlation parameter, but the example embodiments are not limited thereto. The asymmetrical overlay value 82 may be calculated as the product of the polynomial function A and the second correlation parameter $K_2$. The following Equation 4 may represent the asymmetrical overlay value 82, the polynomial function A, and the second correlation parameter $K_2$, but the example embodiments are not limited thereto.

$$\begin{pmatrix} dx_{21} \\ dx_{22} \\ dx_{23} \\ \vdots \\ dx_{2n} \end{pmatrix} = \begin{pmatrix} 1 & x_1 & y_1 & x_1^2 & \cdots \\ 1 & x_2 & y_3 & x_2^2 & \cdots \\ 1 & x_3 & y_3 & x_3^2 & \cdots \\ \vdots & \vdots & \vdots & \vdots & \vdots \\ 1 & x_n & y_n & x_n^2 & \cdots \end{pmatrix} \begin{pmatrix} K_{21} \\ K_{23} \\ K_{25} \\ \vdots \\ K_{22n-1} \end{pmatrix} \quad \text{[Equation 4]}$$

$$\begin{pmatrix} dy_{21} \\ dy_{22} \\ dy_{23} \\ \vdots \\ dy_{2n} \end{pmatrix} = \begin{pmatrix} 1 & y_1 & x_1 & y_1^2 & \cdots \\ 1 & y_2 & x_3 & y_2^2 & \cdots \\ 1 & y_3 & x_3 & y_3^2 & \cdots \\ \vdots & \vdots & \vdots & \vdots & \vdots \\ 1 & y_n & x_n & y_n^2 & \cdots \end{pmatrix} \begin{pmatrix} K_{22} \\ K_{24} \\ K_{26} \\ \vdots \\ K_{22n} \end{pmatrix}$$

In Equation 4, the elements $dx_{21}$ and $dy_{21}$ may each be the asymmetrical overlay value 82 obtained at random and/or desired positions $x_1$ and $y_1$, respectively. Likewise, the elements $dx_{22}$, $dx_{23}$, ..., and $dx_{2n}$ may each be the asymmetrical overlay value 82 measured at random and/or desired positions $x_2$, $x_3$, ..., and $x_n$, respectively, and the elements $dy_{22}$, $dy_{23}$, ..., and $dy_{2n}$ may each be the asymmetrical overlay value 82 measured at random and/or desired positions $y_2$, $y_3$, ..., and $y_n$, respectively. Additionally, according to some example embodiments, the parameters may also include a component in a third direction Z, e.g., three-dimensional components, for use with a three-dimensional image obtained from an electron scanning microscope, depth sensing camera, etc. The elements $K_{21}$, $K_{23}$, $K_{25}$, ..., and $K_{22n-1}$ may each be the second correlation parameter $K_2$ obtained at random and/or desired positions $x_1$, $x_2$, $x_3$, ..., and $x_n$, respectively. The elements $K_{22}$, $K_{24}$, $K_{26}$, ..., and $K_{22n}$ may each be the second correlation parameter $K_2$ obtained at random and/or desired positions $y_1$, $y_2$, $y_3$, ..., and $y_n$, respectively. For example, the second correlation parameter $K_2$ may include a rotation parameter, a scale parameter, and an offset parameter of the second central line 54 relative to the first central line 52 of the lower pattern 62. For example, the elements $K_{21}$ and $K_{22}$ may each be the second offset parameter. The elements $K_{23}$ and $K_{24}$ may each be the second scale parameter. The elements $K_{25}$ and $K_{26}$ may each be the second rotation parameter. Accordingly, the second correlation parameter $K_2$ may include the second offset parameter, the second scale parameter, and the second rotation parameter.

Figure 6:
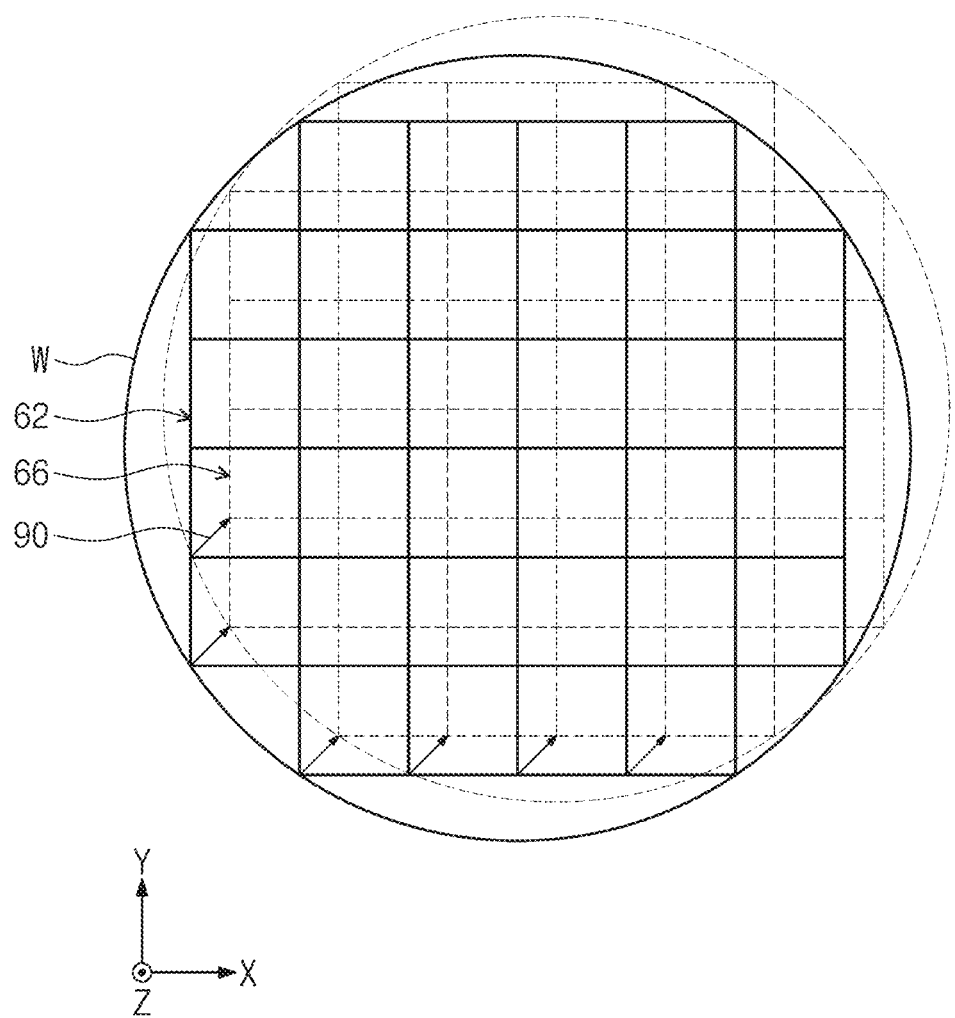
Figure 10:
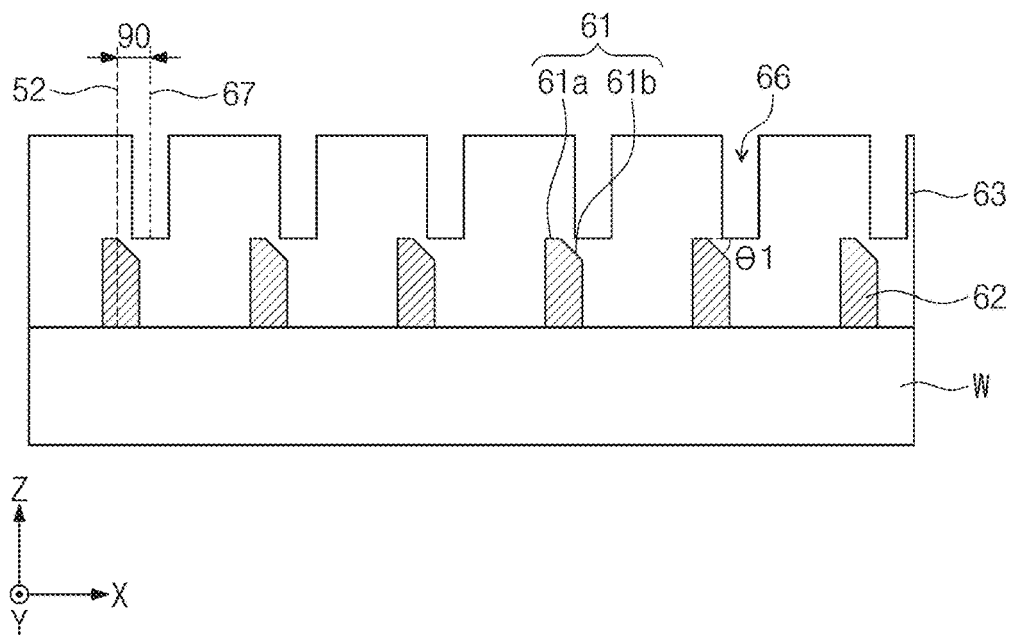

Referring to FIGS. 2, 6, and 10, the unit process apparatus 50 may use the photoresist pattern 64 to form the upper pattern 66 (S70), but is not limited thereto. For example, the upper pattern 66 may be formed by an etching process in which the photoresist pattern 64 is used as an etching mask to etch the upper thin layer 63, etc. An etching error may cause the upper pattern 66 to be formed spaced apart from the lower pattern 62. The upper pattern 66 may be, for example, a hole pattern, etc. Additionally, the upper pattern 66 may be an embossed pattern on the substrate W, but is not limited thereto.

The host computer 10 and/or the electron microscope 60 may measure the upper pattern 66 to obtain the ACI overlay value 90 (S80). The host computer 10 and/or the electron microscope 60 may obtain an image of the upper pattern 66, and based on the obtained image of the upper pattern 66, may also obtain a fourth central line 67 of the upper pattern 66. For example, the ACI overlay value 90 may correspond to a third distance between the first central line 52 and the fourth central line 67. The ACI overlay value 90 may be a miss-reading-correction (MRC) value. The ACI overlay value 90 may be represent by a regression equation such as Equation 5 below, but the example embodiments are not limited thereto.

$$U_3 = AK_3 \qquad \text{[Equation 5]}$$

In Equation 5, the term $U_3$ may correspond to the ACI overlay value 90, the term A may be a polynomial function, and the term $K_3$ may be a third correlation parameter. The ACI overlay value 90 may be calculated as the product of the polynomial function A and the third correlation parameter $K_3$. A matrix such as Equation 6 below may represent the ACI overlay value 90, the polynomial function A, and the third correlation parameter $K_3$, but the example embodiments are not limited thereto.

$$\begin{pmatrix} dx_{31} \\ dx_{32} \\ dx_{33} \\ \vdots \\ dx_{3n} \end{pmatrix} = \begin{pmatrix} 1 & x_1 & y_1 & x_1^2 & \ldots \\ 1 & x_2 & y_3 & x_2^2 & \ldots \\ 1 & x_3 & y_3 & x_3^2 & \ldots \\ \vdots & \vdots & \vdots & \vdots & \vdots \\ 1 & x_n & y_n & x_n^2 & \ldots \end{pmatrix} \begin{pmatrix} K_{31} \\ K_{33} \\ K_{35} \\ \vdots \\ K_{32n-1} \end{pmatrix} \qquad \text{[Equation 6]}$$

$$\begin{pmatrix} dy_{31} \\ dy_{32} \\ dy_{33} \\ \vdots \\ dy_{32n} \end{pmatrix} = \begin{pmatrix} 1 & y_1 & x_1 & y_1^2 & \ldots \\ 1 & y_2 & x_3 & y_2^2 & \ldots \\ 1 & y_3 & x_3 & y_3^2 & \ldots \\ \vdots & \vdots & \vdots & \vdots & \vdots \\ 1 & y_n & x_n & y_n^2 & \ldots \end{pmatrix} \begin{pmatrix} K_{32} \\ K_{34} \\ K_{36} \\ \vdots \\ K_{32n} \end{pmatrix}$$

In Equation 6, the elements $dx_{31}$ and $dy_{31}$ may each be the ACI overlay value 90 obtained at random and/or desired positions $x_1$ and $y_1$, respectively. Additionally, according to some example embodiments, the parameters may also include a component in a third direction Z, e.g., three-dimensional components, for use with a three-dimensional image obtained from an electron scanning microscope, depth sensing camera, etc. Likewise, the elements $dx_{32}$, $dx_{33}$, ..., and $dx_{3n}$ may each be the ACI overlay value 90 measured at random and/or desired positions $x_2, x_3, \ldots$, and $x_n$, respectively, and the elements $dy_{32}$, $dy_{33}$, ..., and $dy_{3n}$ may each be the ACI overlay value 90 measured at random and/or desired positions $y_2, y_3, \ldots$, and $y_n$, respectively. The elements $K_{31}, K_{33}, K_{35}, \ldots$, and $K_{32n-1}$ may each be the third correlation parameter $K_3$ obtained at random and/or desired positions $x_1, x_2, x_3, \ldots$, and $x_n$, respectively. The elements $K_{32}, K_{34}, K_{36}, \ldots$, and $K_{32n}$ may each be the third correlation parameter $K_3$ obtained at random and/or desired positions $y_1, y_2, y_3, \ldots$, and $y_n$, respectively. For example, the third correlation parameter $K_3$ may include a rotation parameter, a scale parameter, and an offset parameter of the fourth central line 67 relative to the first central line 52, but are not limited thereto. For example, the elements $K_{31}$ and $K_{32}$ may each be the third offset parameter. The elements $K_{33}$ and $K_{34}$ may each be the third scale parameter. The elements $K_{35}$ and $K_{36}$ may each be the third rotation parameter. Accordingly, the third correlation parameter $K_3$ may include the third offset parameter, the third scale parameter, and the third rotation parameter.

The host computer 10 and/or the electron microscope 60 may obtain a first overlay skew value by subtracting the ADI overlay value 80 from the ACI overlay value 90 (S90). The first overlay skew value may be $U_3 - U_1 = A(K_3 - K_1)$, a difference between the ACI overlay value 90 and the ADI overlay value 80. A matrix such as Equation 7 below may represent the first overlay skew value, but the example embodiments are not limited thereto.

$$\begin{pmatrix} dx_{31} - dx_{11} \\ dx_{32} - dx_{12} \\ dx_{33} - dx_{13} \\ \vdots \\ dx_{3n} - dx_{1n} \end{pmatrix} = \begin{pmatrix} 1 & x_1 & y_1 & x_1^2 & \ldots \\ 1 & x_2 & y_3 & x_2^2 & \ldots \\ 1 & x_3 & y_3 & x_3^2 & \ldots \\ \vdots & \vdots & \vdots & \vdots & \vdots \\ 1 & x_n & y_n & x_n^2 & \ldots \end{pmatrix} \begin{pmatrix} K_{31} - K_{11} \\ K_{32} - K_{13} \\ K_{35} - K_{15} \\ \vdots \\ K_{32n-1} - K_{12n-1} \end{pmatrix} \qquad \text{[Equation 7]}$$

$$\begin{pmatrix} dy_{31} - dy_{11} \\ dy_{32} - dy_{12} \\ dy_{33} - dy_{13} \\ \vdots \\ dy_{3n} - dy_{1n} \end{pmatrix} = \begin{pmatrix} 1 & y_1 & x_1 & y_1^2 & \ldots \\ 1 & y_2 & x_3 & y_2^2 & \ldots \\ 1 & y_3 & x_3 & y_3^2 & \ldots \\ \vdots & \vdots & \vdots & \vdots & \vdots \\ 1 & y_n & x_n & y_n^2 & \ldots \end{pmatrix} \begin{pmatrix} K_{32} - K_{12} \\ K_{34} - K_{14} \\ K_{36} - K_{16} \\ \vdots \\ K_{32n} - K_{12n} \end{pmatrix}$$

In Equation 7, the elements $dx_{31} - dx_{11}$ and $dy_{31} - dy_{11}$ may each be the first overlay skew value at random and/or desired positions $x_1$ and $y_1$, respectively. Additionally, according to some example embodiments, the parameters may also include a component in a third direction Z, e.g., three-dimensional components, for use with a three-dimensional image obtained from an electron scanning microscope, depth sensing camera, etc. The elements $dx_{32} - dx_{12}$, $dx_{33} - dx_{13}, \ldots$, and $dx_{3n} - dx_{1n}$ may each be the first overlay skew value measured at random and/or desired positions $x_2$, $x_3, \ldots$, and $x_n$, respectively, and the elements $dy_{32} - dy_{12}$, $dy_{33} - dy_{13}, \ldots$, and $dy_{3n} - dy_{1n}$ may each be the first overlay skew value measured at random and/or desired positions $y_2$, $y_3, \ldots$, and $y_n$, respectively. The elements $K_{31} - K_{11}$, $K_{33} - K_{13}, K_{35} - K_{15}, \ldots, K_{32n-1} - K_{12n-1}$ may each be $K_3 - K_1$, a difference between the third and first correlation parameters $K_3$ and $K_1$ obtained at random and/or desired positions $x_1, x_2, x_3, \ldots$, and $x_n$, respectively. The elements $K_{32} - K_{12}$, $K_{34} - K_{14}$, $K_{36} - K_{16}, \ldots$, and $K_{32n} - K_{12}n$ may each be $K_3 - K_1$, a difference between the third and first correlation parameters $K_3$ and $K_1$ measured at random and/or desired positions $y_1, y_2, y_3, \ldots$, and $y_n$, respectively. The first overlay skew value may be a first overlay correction value.

For example, when the processing circuitry of the host computer uses the first overlay skew value to adjust a position of the photoresist pattern 64 which will be formed on a subsequent substrate, the upper pattern 66 may be formed adjacent to a desired and/or predetermined position with respect to the lower pattern 62. However, the upper pattern 66 may be formed to have the asymmetrical overlay value 82, and/or an error relative to the desired and/or predetermined position, which the asymmetrical overlay value 82 corresponds to the second distance between the first central line 52 and the second central line 54. When the processing circuitry of the host computer adds or subtracts the asymmetrical overlay value 82 to or from the first overlay skew value, the upper pattern 66 may be formed without error on the desired and/or predetermined position.

The asymmetrical overlay value 82 may change in proportion to a weighting coefficient (see C of FIG. 11) based on the substrate W or a lot, etc.

Figure 11:
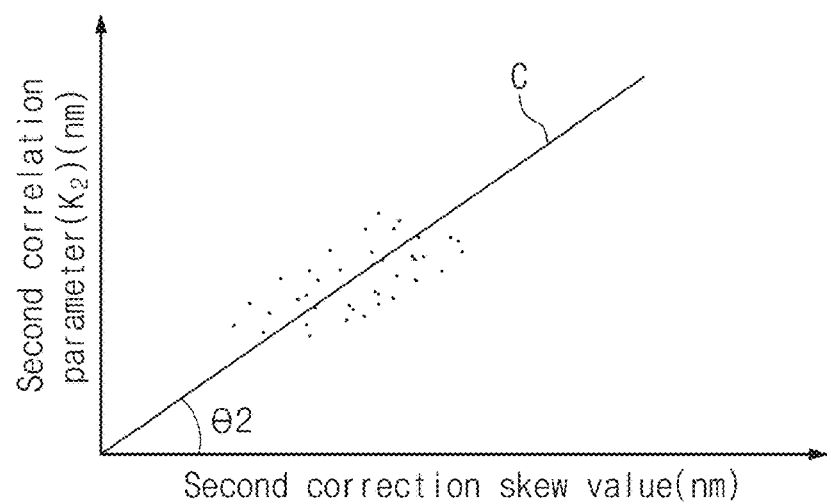
FIG. 11 illustrates a graph showing a weighting coefficient calculated with an electron microscope of FIG. 1 according to at least one example embodiment.

FIG. 11 shows the weighting coefficient C calculated with the electron microscope 60 of FIG. 1 according to at least one example embodiment.

Referring to FIGS. 2 and 11, the host computer 10 and/or the electron microscope 60 may multiply the asymmetric overlay value 82 by the weighting coefficient C (S100). The weighting coefficient C may be an experimental value, and may be obtained based on the number of the substrate W or the lot. For example, the weighting coefficient C may be determined in proportion to a slope θ2 of the second correlation parameter $K_2$, but is not limited thereto. Additionally or alternatively, the weighting coefficient C may be determined by a training set method. The weighting coefficient C may include a rational number. The weighting coefficient C may be constant regardless of the second correlation parameter $K_2$. Additionally, the parameters included in the second correlation parameter $K_2$ may be multiplied by differently-valued weighting coefficients C. For example, the second offset parameter, the second scale parameter, and the second rotation parameter may be multiplied by the weighting coefficients C having different values from each other, but the example embodiments are not limited thereto.

Referring back to FIG. 2, the host computer 10 and/or the electron microscope 60 may obtain a second overlay skew value by adding the asymmetrical overlay value 82 to the first overlay skew value (S110), but the example embodiments are not limited thereto. The second overlay skew value may be $U_3-U_1+CU_2=A(K_3-K_1+CK_2)$, a sum of the first overlay skew value and the asymmetrical overlay value 82, etc. The second overlay skew value may be a second overlay correction value. A matrix such as Equation 8 below may represent the second overlay skew value, but the example embodiments are not limited thereto.

$$\begin{pmatrix} dx_{31} - dx_{11} + Cdx_{21} \\ dx_{32} - dx_{12} + Cdx_{22} \\ dx_{33} - dx_{13} + Cdx_{23} \\ \vdots \\ dx_{3n} - dx_{1n} + Cdx_{2n} \end{pmatrix} = $$

[Equation 8]

$$\begin{pmatrix} 1 & x_1 & y_1 & x_1^2 & \cdots \\ 1 & x_2 & y_3 & x_2^2 & \cdots \\ 1 & x_3 & y_3 & x_3^2 & \cdots \\ \vdots & \vdots & \vdots & \vdots & \vdots \\ 1 & x_n & y_n & x_n^2 & \cdots \end{pmatrix} \begin{pmatrix} K_{31} - K_{11} + CK_{21} \\ K_{33} - K_{13} + CK_{23} \\ K_{35} - K_{15} + CK_{25} \\ \vdots \\ K_{32n-1} - K_{12n-1} + CK_{22n-1} \end{pmatrix}$$

$$\begin{pmatrix} dy_{31} - dy_{11} + Cdy_{21} \\ dy_{32} - dy_{12} + Cdy_{22} \\ dy_{33} - dy_{13} + Cdy_{23} \\ \vdots \\ dy_{3n} - dy_{1n} + Cdy_{22n} \end{pmatrix} = $$

$$\begin{pmatrix} 1 & y_1 & x_1 & y_1^2 & \cdots \\ 1 & y_2 & x_3 & y_2^2 & \cdots \\ 1 & y_3 & x_3 & y_3^2 & \cdots \\ \vdots & \vdots & \vdots & \vdots & \vdots \\ 1 & y_n & x_n & y_n^2 & \cdots \end{pmatrix} \begin{pmatrix} K_{32} - K_{12} + CK_{22} \\ K_{34} - K_{14} + CK_{24} \\ K_{36} - K_{16} + CK_{26} \\ \vdots \\ K_{32n} - K_{12n} + CK_{22n} \end{pmatrix}$$

In Equation 8, the elements $dx_{31}-dx_{11}+Cdx_{21}$ and $dy_{31}-dy_{11}+Cdy_{21}$ may each be the second overlay skew value at random and/or desired positions $x_1$ and $y_1$, respectively. Additionally, according to some example embodiments, the parameters may also include a component in a third direction Z, e.g., three-dimensional components, for use with a three-dimensional image obtained from an electron scanning microscope, depth sensing camera, etc. The elements $dx_{32}-dx_{12}+Cdx_{22}$, $dx_{33}-dx_{13}+Cdx_{23}$, ..., and $dx_{3n}-dx_{1n}+Cdx_{2n}$ may each be the second overlay skew value measured at random and/or desired positions $x_2$, $x_3$, ..., and $x_n$, respectively, and the elements $dy_{32}-dy_{12}+Cdy_{22}$, $dy_{33}-dy_{13}+Cdy_{23}$, ..., and $dy_{3n}-dy_{1n}+Cdy_{22n}$ may each be the second overlay skew value measured at random and/or desired positions $y_2$, $y_3$, ..., and $y_n$, respectively. The elements $K_{31}-K_{11}+CK_{21}$, $K_{33}-K_{13}+CK_{23}$, $K_{35}-K_{15}+CK_{25}$, ..., $K_{32n-1}-K_{12n-1}+CK_{22n-1}$ may each be $K_3-K_1+K_2$, a sum of the second correlation parameter $K_2$ and the difference between the third and first correlation parameters $K_3$ and $K_1$ obtained at random and/or desired positions $x_1$, $x_2$, $x_3$, ..., and $x_n$, respectively. The elements $K_{32}-K_{12}+CK_{22}$, $K_{34}-K_{14}+CK_{24}$, $K_{36}-K_{16}+CK_{26}$, ..., and $K_{32n}-K_{12n}+CK_{22n}$ may each be $K_3-K_1+K_2$, a sum of the second correlation parameter $K_2$ and the difference between the third and first correlation parameters $K_3$ and $K_1$ measured at random and/or desired positions $y_1$, $y_2$, $y_3$, ..., and $y_n$, respectively. The second overlay skew value may be a second overlay correction value.

The host computer 10, spinner apparatus 20, and/or the exposure apparatus 30 may use the second overlay skew value to form the photoresist pattern 64 on a different substrate (S120). The host computer 10 may transfer the second overlay skew value from the electron microscope 60 to the exposure apparatus 30. When the host computer 10 and/or exposure apparatus 30 adjusts a position of the photoresist pattern 64 which will be formed on the substrate W using the second overlay skew value, the upper pattern 66 may be exactly formed without error, or with reduced error, on a desired and/or predetermined position with respect to the lower pattern 62. For example, the lower pattern 62 and the upper pattern 66 may overlap each other without error, or reduced error.

Figure 12:
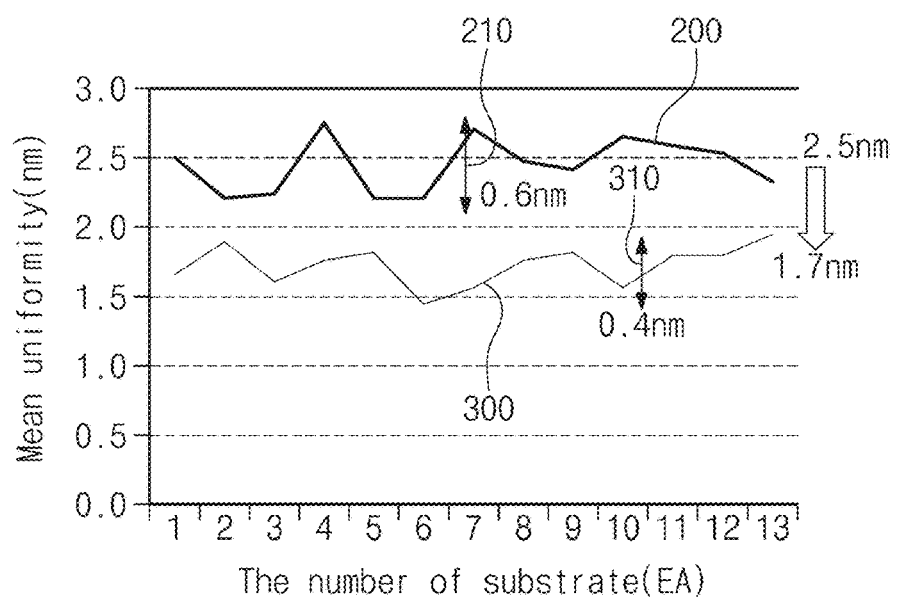
FIG. 12 illustrates a graph showing uniformities of first and second overlay skew values calculated with an electron microscope of FIG. 1 according to at least one example embodiment.

FIG. 12 shows a first mean 210 and a first uniformity 200 of the ACI overlay value 90 to which the first overlay skew value is applied, and also shows a second mean 310 and a second uniformity 300 of the ACI overlay value 90 to which the second overlay skew value is applied according to at least one example embodiment.

Referring to FIG. 12, the second uniformity 300 of the ACI overlay value 90 to which the second overlay skew value is applied may be less than the first uniformity 200 of the ACI overlay value 90 to which the first overlay skew value is applied, and the second mean 310 of the ACI overlay value 90 to which the second overlay skew value is applied may be less than the first mean 210 of the ACI overlay value 90 to which the first overlay skew value is applied. For example, the second uniformity 300 may be about 1.7 nm, and the first uniformity 200 may be about 2.5 nm, but the example embodiments are not limited thereto. The second mean 310 may be about 0.4 nm, and the first mean 210 may be about 0.6 nm, but the example embodiments are not limited thereto. Accordingly, the second overlay skew value may improve uniformity of overlay correction values. As a result, a semiconductor fabrication method according to some example embodiments of the present inventive concepts may use the asymmetrical overlay value 82 that decreases and/or improves the first overlay skew value, which may result in an improvement in uniformity of the overlay correction value and decreasing the number of errors in the fabricated semiconductor device.

As discussed above, an overlay correction method according to some example embodiments of the present inventive concepts may use the asymmetrical overlay value that corresponds to a difference between the ADI overlay value and the ACI overlay value, with the result that the overlay correction value may improve in uniformity and decreases the number of errors in a fabricated semiconductor device.

Although the example embodiments has been described in connection with the some example embodiments of the present inventive concepts illustrated in the accompanying drawings, it will be understood by one of ordinary skill in the art that variations in form and detail may be made therein without departing from the spirit and essential feature of the example embodiments of the present inventive concepts. It will be apparent to those skilled in the art that various substitution, modifications, and changes may be thereto without departing from the scope and spirit of the example embodiments of the inventive concepts.

What is claimed is:

1. An overlay correction method, comprising:
    measuring, using processing circuitry, a lower pattern on a substrate to obtain a first central line of the lower pattern;
    forming, using the processing circuitry, a photoresist pattern on the lower pattern;
    measuring, using the processing circuitry, a first distance between a second central line of an upper flat surface of the lower pattern and a third central line of the photoresist pattern;
    calculating, using the processing circuitry, an after-development-inspection (ADI) overlay value based on the measured first distance;
    measuring, using the processing circuitry, a second distance between the second central line and the first central line;
    calculating, using the processing circuitry, an asymmetrical overlay value based on the measured second distance;
    forming, using the processing circuitry, an upper pattern on the substrate using the photoresist pattern;
    measuring, using the processing circuitry, a third distance between the first central line and a fourth central line of the upper pattern;
    calculating, using the processing circuitry, an after-cleaning-inspection (ACI) overlay value based on the measured third distance;
    calculating, using the processing circuitry, a first overlay skew value based on the ADI overlay value and the ACI overlay value;
    calculating, using the processing circuitry, a second overlay skew value based on the asymmetrical overlay value and the first overlay skew value; and
    adjusting, using the processing circuitry, a position of the photoresist pattern based on the second overlay skew value.

2. The overlay correction method of claim 1, wherein the calculating the ADI overlay value includes calculating a product of a polynomial function and a first correlation parameter.

3. The overlay correction method of claim 2, wherein the calculating the asymmetrical overlay value includes calculating a product of the polynomial function and a second correlation parameter.

4. The overlay correction method of claim 3, further comprising:
    multiplying, using the processing circuitry, the asymmetrical overlay value by a weighting coefficient.

5. The overlay correction method of claim 4, further comprising:
    multiplying, using the processing circuitry, the second correlation parameter by the weighting coefficient.

6. The overlay correction method of claim 3, wherein the calculating the ACI overlay value includes calculating a product of the polynomial function and a third correlation parameter.

7. The overlay correction method of claim 6, wherein the first to third correlation parameters include respective first to third offset parameters, respective first to third scale parameters, and respective first to third rotation parameters.

8. The overlay correction method of claim 1, further comprising:
    forming, using the processing circuitry, an upper thin layer between the lower pattern and the photoresist pattern,
    wherein the upper pattern is formed in the upper thin layer.

9. The overlay correction method of claim 1, wherein the lower pattern is measured with an electron microscope.

10. The overlay correction method of claim 9, wherein
    the lower pattern and the photoresist pattern are measured with an optical microscope; and
    the upper pattern is measured with the electron microscope.

11. An overlay correction method, comprising:
    forming, using processing circuitry, an upper thin layer on a lower pattern of a substrate;
    forming, using the processing circuitry, a photoresist pattern on the upper thin layer;
    measuring, using the processing circuitry, a first distance between a central line of an upper flat surface of the lower pattern and a central line of the photoresist pattern;
    calculating, using the processing circuitry, an after-development-inspection (ADI) overlay value based on the measured first distance;
    measuring, using the processing circuitry, a second distance between a central line of the lower pattern and the central line of the upper flat surface;
    calculating, using the processing circuitry, an asymmetrical overlay value based on the second distance;
    etching, using the processing circuitry, the upper thin layer using the photoresist pattern as an etching mask to form an upper pattern on the substrate;
    measuring, using the processing circuitry, a third distance between the central line of the lower pattern and a central line of the upper pattern;
    calculating, using the processing circuitry, an after-cleaning-inspection (ACI) overlay value based on the measured third distance;
    calculating, using the processing circuitry, a first overlay skew value based on the ADI overlay value the ACI overlay value;
    updating, using the processing circuitry, the asymmetrical overlay value based on a weighting coefficient;
    calculating, using the processing circuitry, a second overlay skew value based on the asymmetrical overlay value and the first overlay skew value; and
    adjusting, using the processing circuitry, a position of the photoresist pattern based on the second overlay skew value.

12. The overlay correction method of claim 11, further comprising:
forming, using the processing circuitry, the lower pattern on the substrate; and
measuring, using the processing circuitry, the lower pattern to obtain the central line of the lower pattern.

13. The overlay correction method of claim 11, wherein the calculating the asymmetrical overlay value includes calculating a product of a polynomial function and a correlation parameter.

14. The overlay correction method of claim 13, further comprising:
updating, using the processing circuitry, the correlation parameter based on the weighting coefficient.

15. The overlay correction method of claim 13, wherein the correlation parameter includes an offset parameter, a scale parameter, and a rotation parameter.

16. A semiconductor fabrication method, comprising:
forming, using processing circuitry, a lower pattern on a substrate;
obtaining, using the processing circuitry, a first central line of the lower pattern using an electron microscope;
forming, using the processing circuitry, an upper thin layer on the lower pattern;
forming, using the processing circuitry, a photoresist pattern on the upper thin layer;
measuring, using the processing circuitry, a first distance between a second central line of an upper flat surface of the lower pattern and a third central line of the photoresist pattern using an optical microscope;
calculating, using the processing circuitry, an after-development-inspection (ADI) overlay value based on the measured first distance;
calculating, using the processing circuitry, an asymmetrical overlay value that corresponds to a second distance between the second central line and the first central line;
etching, using the processing circuitry, the upper thin layer using the photoresist pattern as an etching mask to form an upper pattern;
measuring, using the processing circuitry, a third distance between the first central line and a fourth central line of the upper pattern using the electron microscope;
calculating, using the processing circuitry, an after-cleaning-inspection (ACI) overlay value based on the measured third distance;
calculating, using the processing circuitry, a first overlay skew value based on the ADI overlay value and the ACI overlay value;
calculating, using the processing circuitry, a second overlay skew value based on the asymmetrical overlay value and the first overlay skew value; and
adjusting, using the processing circuitry, a position of the photoresist pattern based on the second overlay skew value.

17. The semiconductor fabrication method of claim 16, further comprising:
forming, using the processing circuitry, a photoresist pattern on a different substrate based on the adjusted position of the photoresist pattern.

18. The semiconductor fabrication method of claim 17, wherein the lower pattern includes a metal pattern.

19. The semiconductor fabrication method of claim 17, wherein the upper thin layer includes a dielectric.

20. The semiconductor fabrication method of claim 16, further comprising:
updating, using the processing circuitry, the asymmetrical overlay value based on a weighting coefficient.

* * * * *